United States Patent
Zhang (10) Patent No.: US 11,075,646 B2
(45) Date of Patent: Jul. 27, 2021

(54) Σ-Δ MODULATOR AND METHOD FOR REDUCING NONLINEAR ERROR AND GAIN ERROR (71) Applicant: JIANGSU RUNIC TECHNOLOGY CO., LTD., Wuxi (CN)

(72) Inventor: Ming Zhang, Wuxi (CN)

(73) Assignee: JIANGSU RUNIC TECHNOLOGY CO., LTD., Wuxi (CN)

(*) Notice: Subject to any disclaimer, the term of this patent is extended or adjusted under 35 U.S.C. 154(b) by 0 days.

(21) Appl. No.: 17/041,085

(22) PCT Filed: May 14, 2019

(86) PCT No.: PCT/CN2019/086824
§ 371 (c)(1),
(2) Date: Sep. 24, 2020

(87) PCT Pub. No.: WO2020/155466
PCT Pub. Date: Aug. 6, 2020

(65) Prior Publication Data
US 2021/0111734 A1   Apr. 15, 2021

(30) Foreign Application Priority Data

Jan. 29, 2019  (CN) .......................... 201910086440.6

(51) Int. Cl.
*H03M 3/00* (2006.01)
(52) U.S. Cl.
CPC ............. *H03M 3/496* (2013.01); *H03M 3/50* (2013.01)

(58) Field of Classification Search
CPC ...... H03M 3/496; H03M 3/50; H03M 1/0663; H03M 1/0665
USPC ......................................... 341/118, 143, 155
See application file for complete search history.

(56) References Cited

U.S. PATENT DOCUMENTS 8,223,053 B2 * 7/2012 Deval ................. H03M 1/0663
341/143
8,339,299 B2 * 12/2012 Quiquempoix ..... H03M 1/0665
341/143

* cited by examiner

*Primary Examiner* — Khai M Nguyen
(74) *Attorney, Agent, or Firm* — Arc IP Law, PC; Joseph J. Mayo (57) ABSTRACT

A delta-sigma (Σ-Δ) modulator and method for reducing nonlinear error and gain error. The Σ-Δ modulator includes: a plurality of sampling capacitors, configured to sample an input voltage or simultaneously sample an input voltage and a reference voltage signal; an operational amplifier; a plurality of switches, configured to select to sample the input voltage and the reference voltage signal; an integrating capacitor, configured to perform integration superposition on the input voltage and the reference voltage signal sampled by the sampling capacitors; and a control assembly, configured to control, to select to sample the reference voltage signal or simultaneously sample the input voltage and the reference voltage signal within a cycle, and to perform clock control on the sampling capacitors that simultaneously sample the input voltage and the reference voltage signal within a next cycle.

14 Claims, 11 Drawing Sheets

Σ-Δ MODULATOR AND METHOD FOR REDUCING NONLINEAR ERROR AND GAIN ERROR

CROSS-REFERENCE TO RELATED APPLICATIONS

This application is a national stage filing under 35 U.S.C. §371 of International Application Number PCT/CN2019/086824, filed May 14, 2019, which claims the priority of Chinese patent application No.201910086440.6 filed Jan. 29, 2019. The contents of these applications are incorporated herein by reference in their entirety.

BACKGROUND OF THE INVENTION

FIELD OF THE INVENTION

The present application relates to the field of ADC analog-to-digital conversion and amplification, and more particularly, to a Σ-Δ modulator.

DESCRIPTION OF THE RELATED ART

ADC (analog-to-digital converter) is an electronic element capable of converting an analog signal into a digital signal, which typically samples and holds a signal followed by simultaneous quantization and coding of the signal during conversion.

Conversion by the ADC generally goes through sampling and holding, as well as quantization and coding. In an actual circuit, some processes, for example, the sampling and the holding are combined, while the quantization and the coding are realized at the same time during conversion.

Sampling theorem: only when a sampling frequency is higher than twice the highest frequency component in the analog signal, can a sampling value reflect an original analog signal without distortion.

Main parameters of the ADC are as follows.

1. Conversion precision, which is described by resolution and conversion error for an integrated ADC.

2. Resolution, which is usually expressed by digits of output binary or decimal number, because the more the digits are, the smaller the quantization unit is, and the higher the resolution of an input signal is. For example, for an input analog voltage ranging from 0 V to 5 V, a minimum analog voltage resolvable with an output 8-digit binary number is $5V \times 2^{-8} = 20$ mV, while a minimum analog voltage resolvable with an output 12-digit binary number is $5V \times 2^{-12} \approx 122$ mV.

3. Conversion error, which refers to a deviation between a measured range and a theoretical range of an analog input voltage corresponding to each digital quantity respectively measured in a whole conversion range after a zero point and a full scale are calibrated, and a maximum deviation is used as an index of the conversion error, which usually appears in a form of relative error and is represented by a LSB as a unit.

4. Conversion speed, which in most cases is a reciprocal of conversion time, and the conversion time is a time required to complete one analog-to-digital conversion.

At present, ADC conversion circuits on the market are mainly divided into three types.

1. Pipelined ADC, which has the highest conversion speed (with a conversion time less than 50 ns).

2. Successive approximation ADC, which has the second highest conversion speed (with a conversion time between 10 μs and 100 μs).

3. Σ-Δ ADC, which has the lowest conversion speed (with a conversion time between tens of milliseconds and hundreds of milliseconds).

The ADCs of the three architectures have their own characteristics, in which the pipelined ADC has a higher speed but a lower precision, the Σ-Δ ADC may achieve a high precision and is mainly used in a low-speed measurement field, such as a wearable type, an electronic scale, medical electronics and the like, and the successive approximation ADC falls in between.

Figure 2:
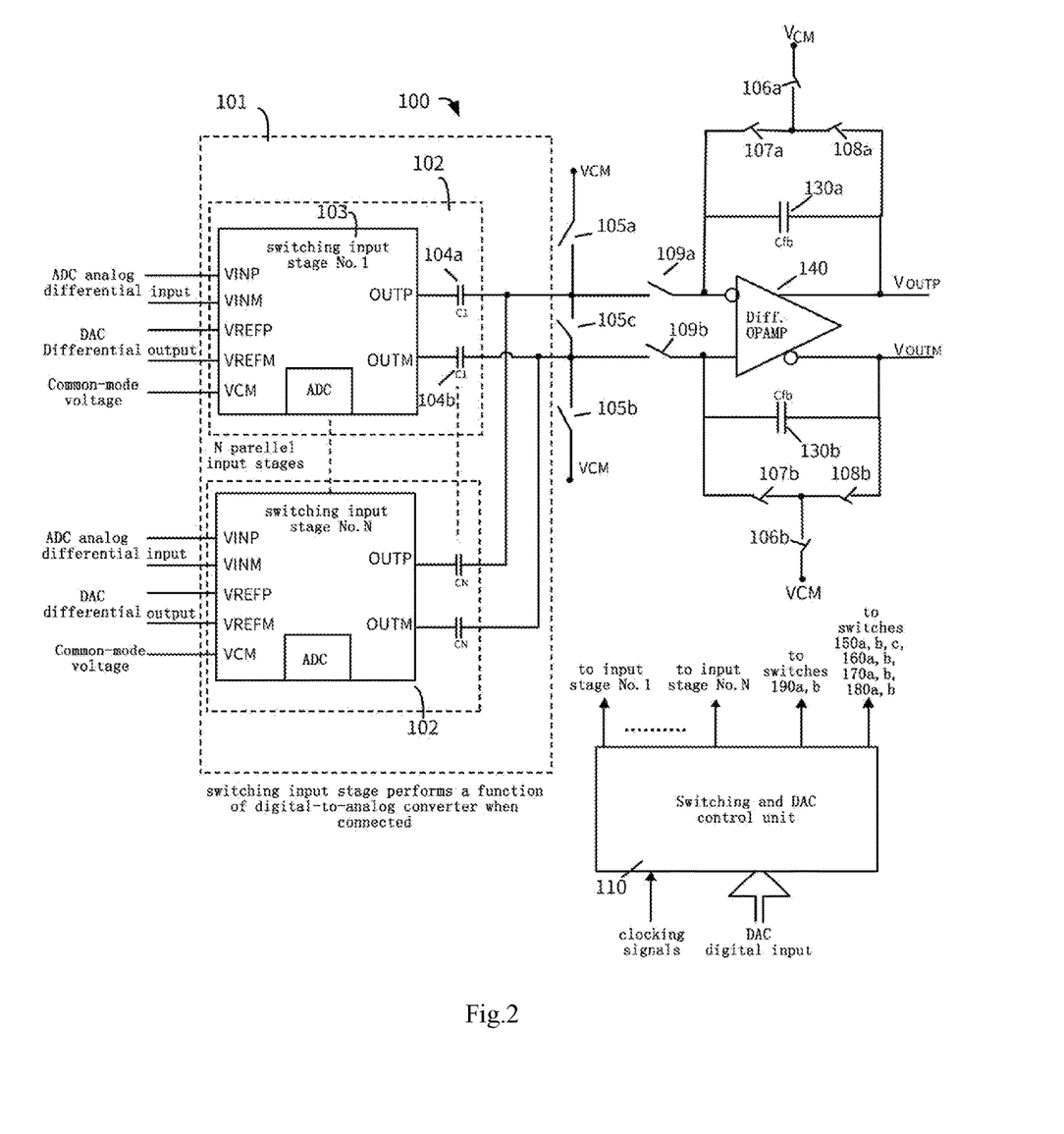
FIG. 2 is a principle diagram of the Σ-Δ ADC in the existing patent.

A traditional Σ-Δ ADC has a gain error and a nonlinear error due to mismatch of capacitor pairs. 2-phase gain calibration and scaling scheme for switched capacitor Σ-Δ modulator is disclosed in the existing art CN201080018375.0, as shown in FIG. 2, the sampling capacitors are divided into R groups of same size capacitors. At each sample, a number of capacitors groups S, with S≤R is used to sample and transfer the input signal voltage during the first two phases. At the same time, R-S groups of capacitors are sampling a common mode voltage signal (or ground for a single-ended circuit), which contribution to the total charge transferred is zero. All R groups of capacitors are used to sample and transfer the DAC voltage during the last two phases. The S/R ratio is well achieved here by using this technique. In order to minimize the mismatch effects, the S groups of capacitors are chosen among the R groups differently at each sample with a certain timing so that all the R groups of capacitors have sampled the same amount of times the input signal after a certain cycle of time. This timing is rotating the input capacitors (the ones that sample the input voltage) in order to average the mismatch errors and this technique can diminish drastically the gain error down to the low ppm levels if the average is done for a certain amount of samples.

The above method reduces the gain error and introduces the following problems at the same time: 1. size of the integrating capacitor is increased, which increases the overall cost; 2. the output swing is large due increasement in size of the integrating capacitor; and 3. the integrating capacitor has a large overshoot during conversion.

BRIEF SUMMARY OF THE INVENTION

The present application provides a Σ-Δ modulator including:

a plurality of sampling capacitors, configured to sample an input voltage or simultaneously sample an input voltage and a reference voltage signal;

an operational amplifier;

a plurality of switches, configured to select to sample the input voltage and the reference voltage signal;

an integrating capacitor, configured to perform integration superposition on the input voltage and the reference voltage signal sampled by the sampling capacitors; and a control assembly, configured to control operation of the switches, to select to sample the reference voltage signal or simultaneously sample the input voltage and the reference voltage signal within a cycle, and to perform clock control on the sampling capacitors that simultaneously sample the input voltage and the reference voltage signal within a next cycle.

Preferably, the reference voltage signal is provided by a digital/analog converter.

Preferably, the digital/analog converter is controlled by the control assembly.

Preferably, a reference voltage provided by the digital/analog converter is distributed to any pair of sampling capacitors, or distributed to idle sampling capacitors while sampling an input voltage signal through operation of the switches.

Preferably, each sampling cycle includes: ¼ cycle of input voltage signal sampling, ½ cycle of charge integration and ½ cycle of reference voltage signal sampling.

Preferably, the ½ cycle of charge integration includes: ½ integration of the input voltage signal and ½ integration of the reference voltage signal, and the integration of the reference voltage signal is superimposed during the integration of the input voltage signal.

The present application further provides a method for sampling by the Σ-Δ modulator, including following steps of:

S1. operating the switches to simultaneously sample the input voltage and the reference voltage signal by the sampling capacitors;

S2. performing integration superposition on the input voltage and the reference voltage signal by the integrating capacitor;

S3. operating the switches to input the reference voltage signal by the sampling capacitors for sampling;

S4. performing integration superposition on the reference voltage signal by the integrating capacitor; and S5. repeating step S1 to step S4.

Preferably, at step S1, the input voltage is sampled by a capacitor pair, and the reference voltage signal is collected by idle capacitors.

Preferably, at step S1, the control assembly controls any pair of switches in an input sampling circuit to be switched off to sample the input voltage; and controls any switch in a reference voltage signal sampling circuit to be switched off to sample the reference voltage signal.

Preferably, at step S3, any pair of switches for the reference voltage signal are switched off to sample the reference voltage signal by a corresponding sampling capacitor pair.

Preferably, at step S3, any pair of switches corresponding to the sampling of the reference voltage signal include or do not include any switch in the reference voltage signal sampling circuit at step S1.

Preferably, the control assembly controls switching of the switches at step S1 to step S4 by using timing control to realize periodic sampling and integral coupling.

Preferably, the control assembly controls the switching of the switches by controlling a pseudo-random number generation timing.

Preferably, the control assembly controls a proportion of an operating cycle at step S1 to step S4.

According to the application, during input sampling, Vref signals of two capacitors are simultaneously sampled, thereby offsetting a problem of an overlarge area of the integrating capacitor. In addition, according to the application, the pseudo random number is used to control a polling timing of the capacitors, so as to be able to solve a common problem of Idle tone of the Σ-Δ modulator, so that the application is able to effectively reduce the area of the integrating capacitor while improving the gain error of the Σ-Δ modulator, thereby reducing manufacturing costs of an integrated circuit and reducing an output swing. The application has a very wide practical value in the field of analog-to-digital conversion.

DETAILED DESCRIPTION OF THE INVENTION

Figure 1:
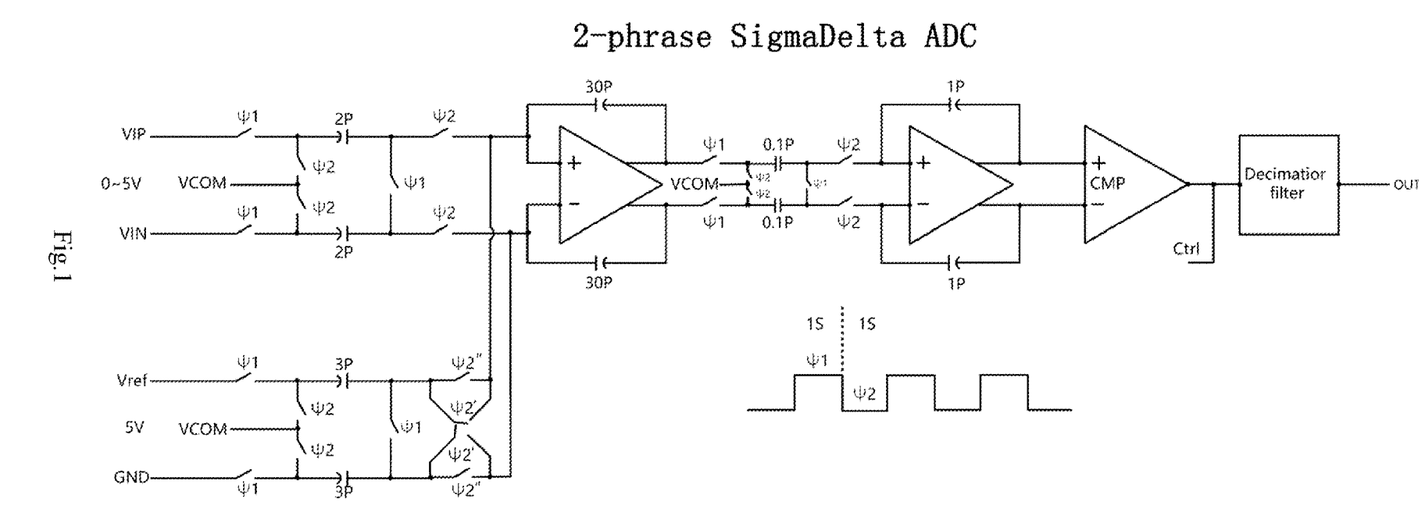
FIG. 1 is a technical principle diagram of the existing common Σ-Δ ADC.

FIG. 1 shows an existing common Σ-Δ ADC, which adopts a most traditional oversampling technology with a principle of noise shaping, so that low-frequency noise is relatively small, thereby achieving a requirement of high precision, but the nonlinear problem is difficult to be solved.

With reference to FIG. 2, based on the Σ-ΔADC shown in FIG. 1, an input signal and a feedback signal are periodically changed at a fixed frequency, so that the nonlinear problem is basically solved. However, control is slightly complicated, and requirement on the integrator is very high due to the equalized timing, resulting in a large chip area, and meanwhile, the problem of Idle Tone is introduced.

In the present application, based on a common Σ-Δ ADC, the input signal and the feedback signal are specially processed to solve the nonlinear problem.

Specifically, in the present application, a Σ-Δ modulator includes:

a plurality of sampling capacitors, configured to sample an input voltage or simultaneously sample an input voltage and a reference voltage signal;

an operational amplifier;

a plurality of switches, configured to select to sample the input voltage and the reference voltage signal;

an integrating capacitor, configured to perform integration superposition on the input voltage and the reference voltage signal sampled by the sampling capacitors; and a control assembly, configured to control operation of the switches, to select to sample the reference voltage signal or simultaneously sample the input voltage and the reference voltage signal within a cycle, and to perform clock control on the sampling capacitors that simultaneously sample the input voltage and the reference voltage signal within a next cycle.

Preferably, the reference voltage signal is provided by a digital/analog converter. Preferably, the above digital/analog converter is controlled by the control assembly. Preferably, the reference voltage provided by the digital/analog converter is distributed to any pair of sampling capacitors or distributed to idle sampling capacitors while sampling an input voltage signal through operation of the switches.

Preferably, each sampling cycle includes: ¼ cycle of input voltage signal sampling, ½ cycle of charge integration and ½ cycle of reference voltage signal sampling.

Preferably, the ½ cycle of charge integration includes: ½ integration of the input voltage signal and ½ integration of the reference voltage signal, and the integration of the reference voltage signal is superimposed during the integration of the input voltage signal.

Figure 3:
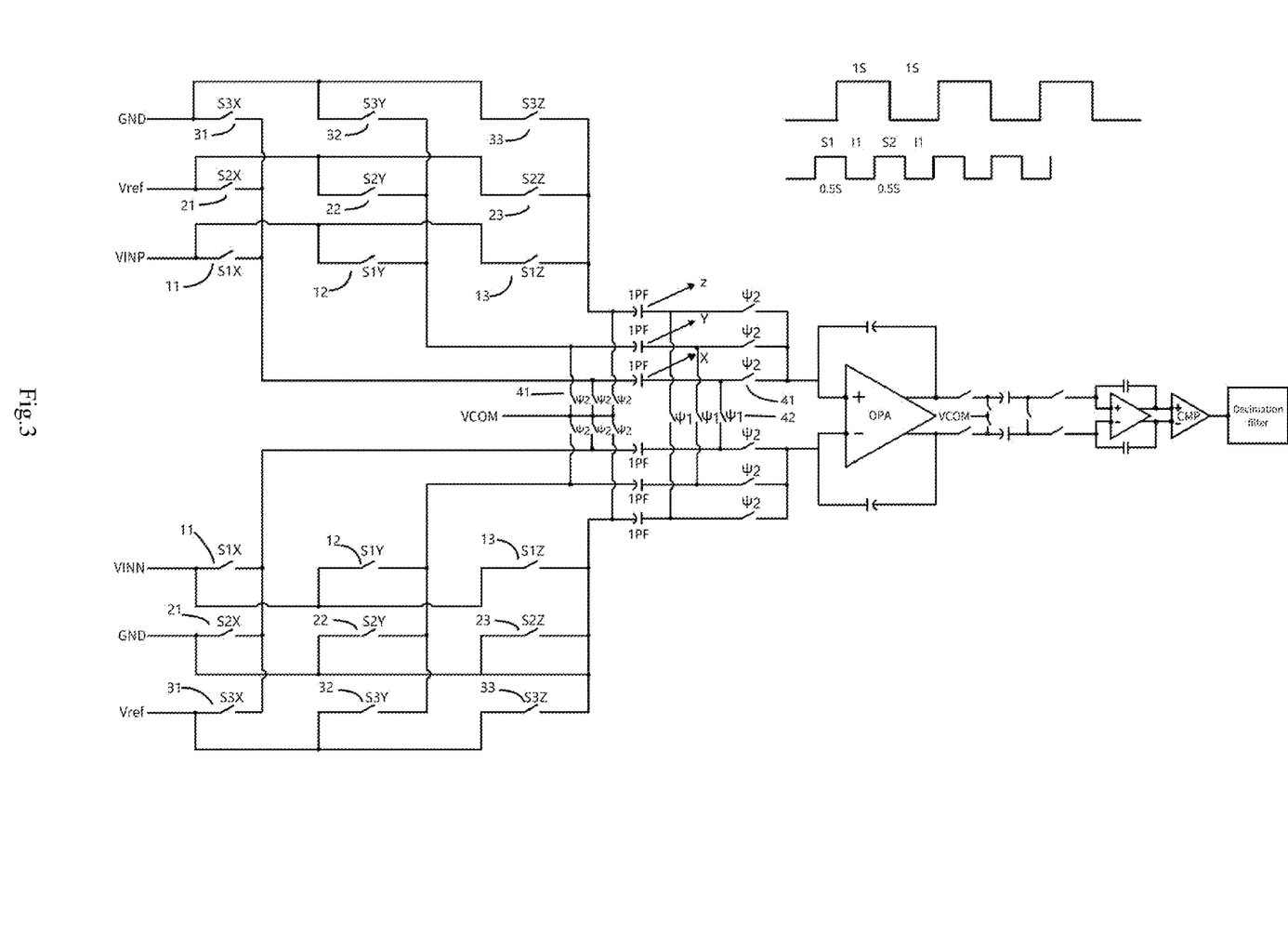
FIG. 3 is a principle diagram of a circuit of the present application.

FIG. 3 shows a principle diagram of the application. The Σ-Δ modulator includes sampling capacitor pairs X, Y and Z, and the six capacitors are the same, configured to sample the input voltage or simultaneously sample the input voltage and the reference voltage signal.

The Σ-Δ modulator includes switch pairs S1X, S1Y, S1Z, S2X, S2Y, S2Z, S3X, S3Y and S3Z9, and each switch pair is switched off to control charging sampling of one pair of sampling capacitors.

The Σ-Δ modulator includes the operational amplifier. In the switch pairs S1X, S1Y, S1Z, S2X, S2Y, S2Z, S3X, S3Y and S3Z9, each switch pair is symmetrically distributed at a forward input end and a reverse input end of the operational amplifier. In the sampling capacitor pairs X, Y and Z, each sampling capacitor pair is also symmetrically connected with the forward input end and the reverse input end of the operational amplifier.

The Σ-Δ modulator includes a pair of integrating capacitors, one of which is connected with an output end and the forward input end, the other one of which is connected with the output end and the reverse input end.

The Σ-Δ modulator includes the control assembly, configured to control switching of the switch pairs S1X, S1Y, S1Z, S2X, S2Y, S2Z, S3X, S3Y and S3Z9, thereby switching the sampling capacitor pairs X, Y and Z.

A method for sampling by the Σ-Δ modulator includes the following steps of: S1. operating the switches to simultaneously sample the input voltage and the reference voltage signal by the sampling capacitors; S2. performing integration superposition on the input voltage and the reference voltage signal by the integrating capacitor; S3. operating the switches to input the reference voltage signal by the sampling capacitors for sampling; S4. performing integration superposition on the reference voltage signal by the integrating capacitor; and S5. repeating step S1 to step S4.

Preferably, at step S1, the input voltage is sampled by a capacitor pair, and the reference voltage signal is collected by idle capacitors.

Preferably, at step S1, the control assembly controls any pair of switches in an input sampling circuit to be switched off to sample the input voltage; and controls any switch in a reference voltage signal sampling circuit to be switched off to sample the reference voltage signal.

Preferably, at step S3, when any pair of switches for the reference voltage signal are switched off, the reference voltage signal is sampled by the corresponding sampling capacitor pair.

Preferably, at step S3, any pair of switches corresponding to the sampling of the reference voltage signal include or do not include any switch in the reference voltage signal sampling circuit at step S1.

Preferably, the control assembly controls switching of the switches at step S1 to step S4 by using timing control to realize periodic sampling and integral coupling.

Preferably, the control assembly controls the switching of the switches by controlling a pseudo-random number generation timing.

Preferably, the control assembly controls a proportion of an operating cycle of step S1 to step S4.

Figure 4:
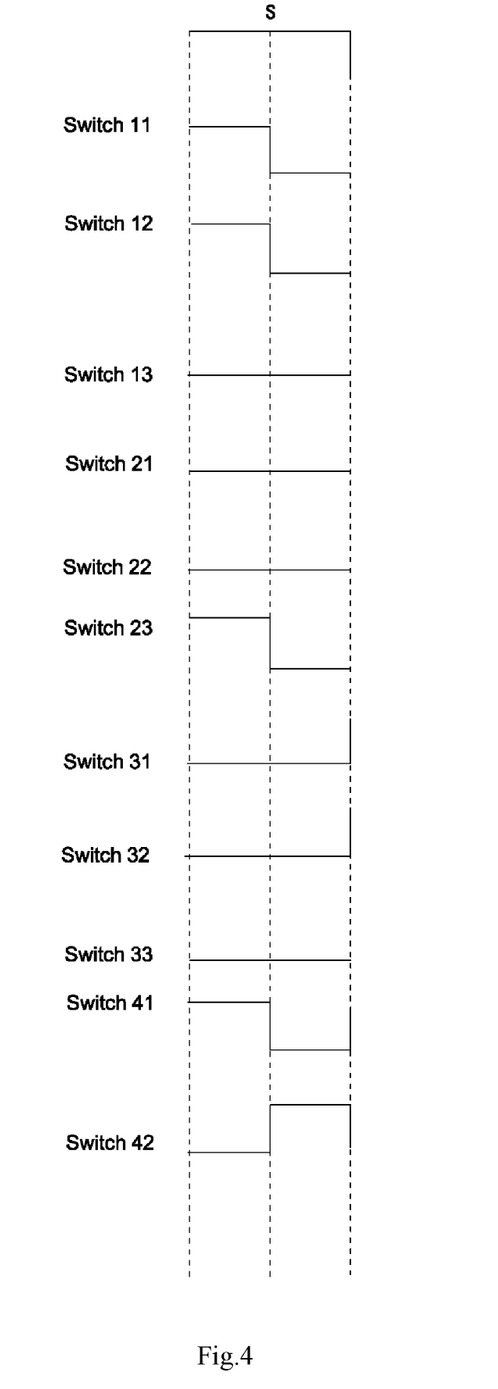
FIG. 4 is a diagram of a control timing of the present application.
Figure 5:
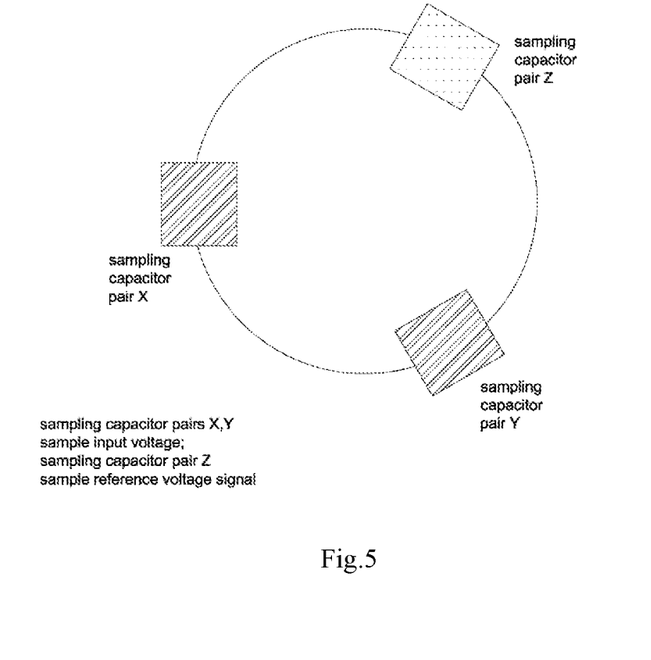
FIG. 5 is a diagram of distribution of sampling capacitor pairs corresponding to FIG. 4.
Figure 6:
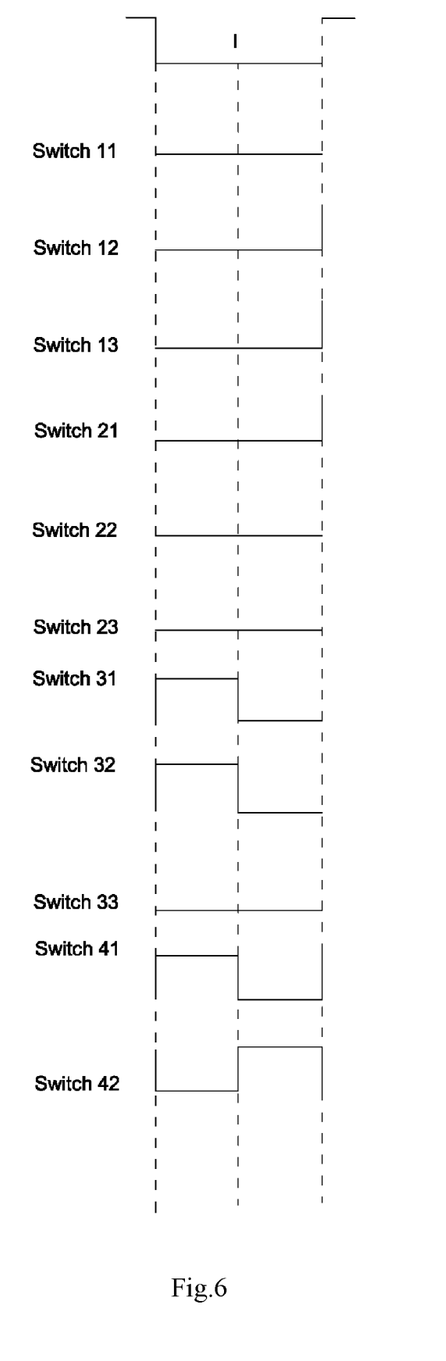
FIG. 6 is a diagram of a control timing of the present application.
Figure 7:
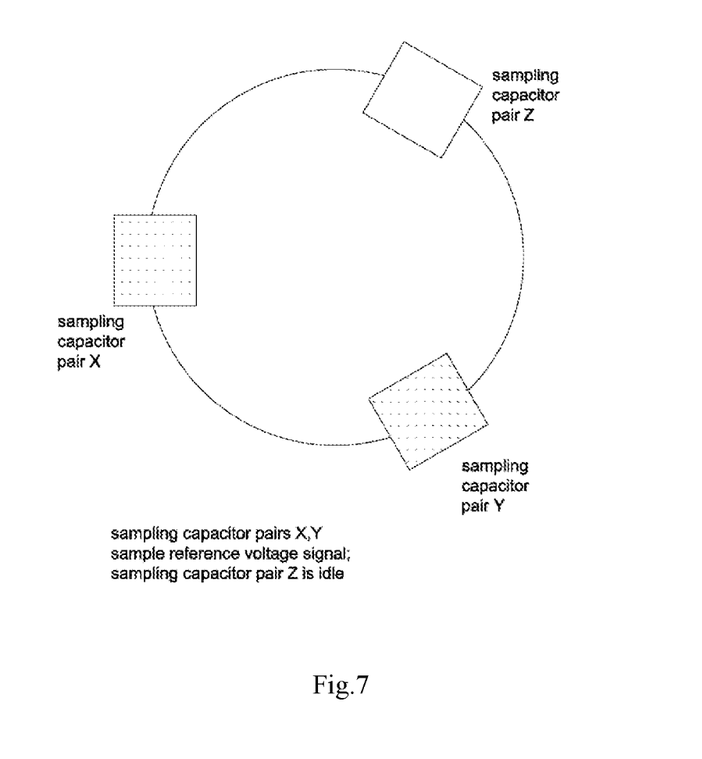
FIG. 7 is a diagram of distribution of sampling capacitor pairs corresponding to FIG. 6.
Figure 8:
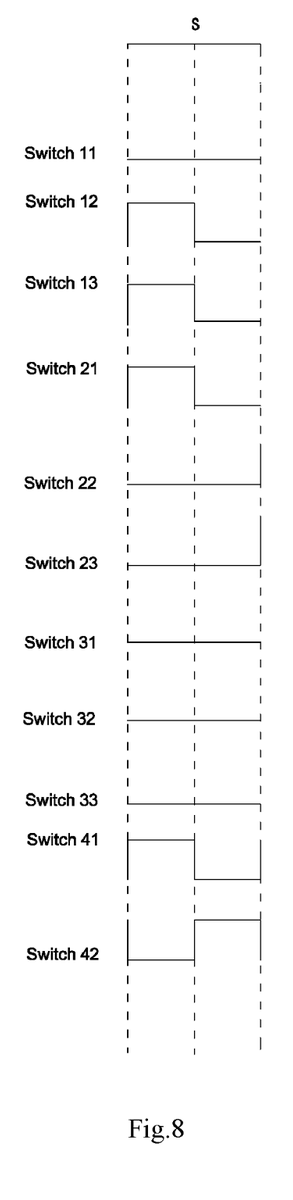
FIG. 8 is a diagram of a control timing of the present application.
Figure 9:
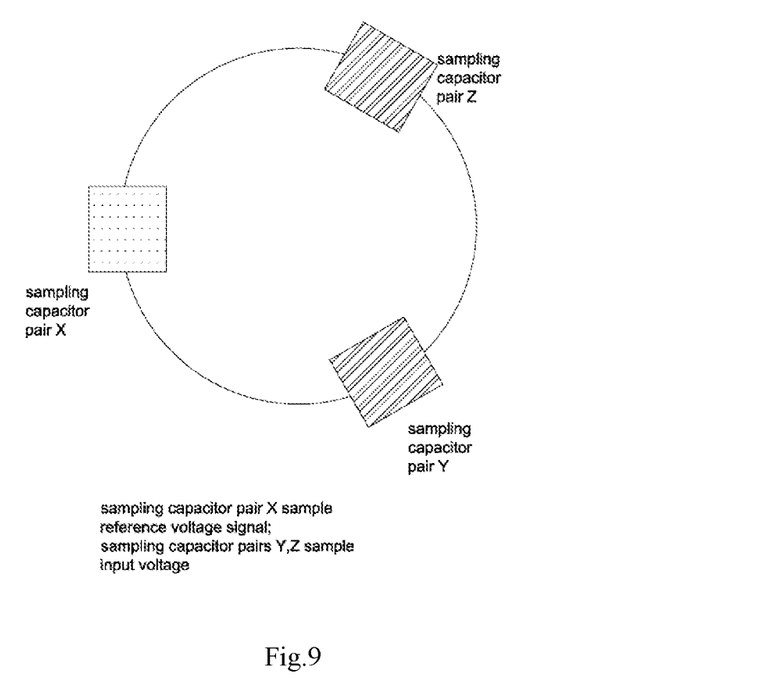
FIG. 9 is a diagram of distribution of sampling capacitor pairs corresponding to FIG. 8.
Figure 10:
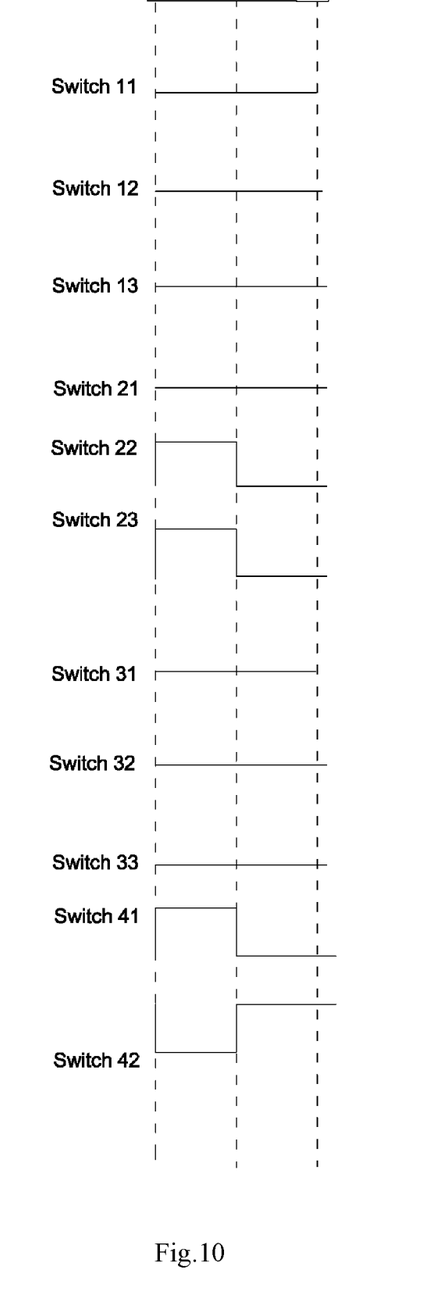
FIG. 10 is a diagram of a control timing of the present application.
Figure 11:
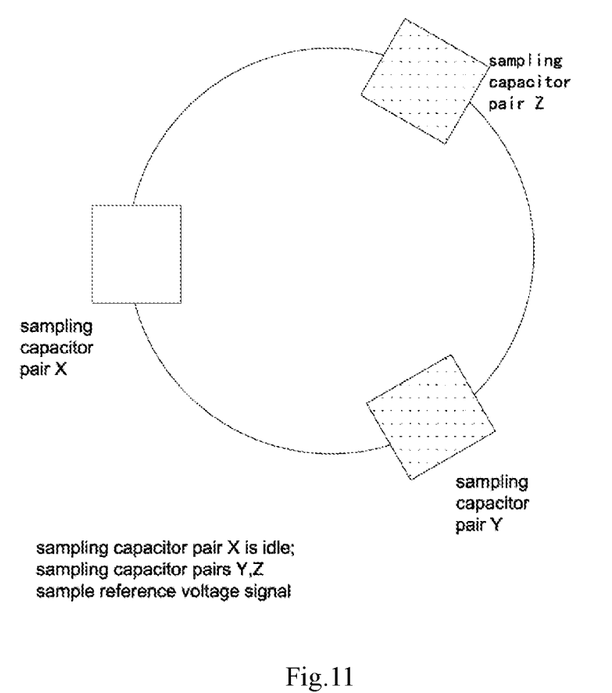
FIG. 11 is a diagram of distribution of sampling capacitor pairs corresponding to FIG. 10.

With reference to FIG. 4 to FIG. 11, one operating cycle is introduced. Input sampling and Vref sampling are performed at the same time. Specifically, switches No. 11 and No. 12 are switched off during the input sampling, and switch No. 33 is switched off at the same time, so that the sampling of input and signal feedback Vref are performed at clock term S1 at the same time, and then charges are integrated to the integrating capacitor at clock term I1. Next, the switches No. 31 and No. 32 are switched off at clock term S2, and the remaining feedback signal Vref is completely sampled, and then the charges are re-integrated to the integrating capacitor at clock 12. Sampling and integration are completed once. In FIG. 4, switches 11, 12 and 13 are switched off. In FIG. 6, switches 31 and 32 are switched off. In FIG. 8, switches 12, 13 and 21 are switched off. In FIG. 10, switches 22 and 23 are switched off.

Actual operation is not limited to the above operating timing and the above operating mode. Only one distribution of sampling capacitor pairs is given in the present application.

The sampling and the integration of the Vref are realized separately, thereby solving a problem of excessively high requirement on an amplifier. Meanwhile, a cycle of sampling and integration is controlled in a pseudo random number mode, so as to control a cycle timing of the switches, thereby controlling a whole process. The pseudo random number is generated by the control assembly.

The above embodiments only illustrate a principle and an effect of the present application, and are not used to limit the present application. Those skilled in the art may make modifications or changes on the above embodiments without violating the principle and scope of the present application. Therefore, all equivalent modifications or changes made by those of ordinary skills in the art without departing from the principle and technical ideas disclosed in the present application should still be included in the claims of the patent application.

What is claimed is:

1. A delta-sigma modulator, comprising:
a plurality of sampling capacitors, configured to sample an input voltage or simultaneously sample said input voltage and a reference voltage signal;
an operational amplifier;
a plurality of switches, configured to select to sample the input voltage and the reference voltage signal;
an integrating capacitor, configured to perform integration superposition on the input voltage and the reference voltage signal sampled by the plurality of sampling capacitors; and
a control assembly, configured to control operation of the plurality of switches, to select to sample the reference voltage signal or simultaneously sample the input voltage and the reference voltage signal within a cycle, and to perform clock control on the plurality of sampling capacitors that simultaneously sample the input voltage and the reference voltage signal within a next cycle.

2. The delta-sigma modulator of claim 1, wherein the reference voltage signal is provided by a digital/analog converter.

3. The delta-sigma modulator of claim 2, wherein the digital/analog converter is controlled by the control assembly.

4. The delta-sigma modulator of claim 2, wherein a reference voltage provided by the digital/analog converter is distributed to any pair of sampling capacitors, or distributed to idle sampling capacitors while sampling an input voltage signal through said operation of the plurality of switches.

5. The delta-sigma modulator of claim 1, wherein each sampling cycle comprises: ¼ cycle of input voltage signal sampling, ½ cycle of charge integration and ½ cycle of reference voltage signal sampling.

6. The delta-sigma modulator of claim 5, wherein the ½ cycle of charge integration comprises: ½ integration of the input voltage signal sampling and ½ integration of the reference voltage signal, and the ½ integration of the reference voltage signal is superimposed during the ½ integration of the input voltage signal sampling.

7. A method for sampling by a delta-sigma modulator, the delta-sigma modulator comprising
   a plurality of sampling capacitors, configured to sample an input voltage or simultaneously sample said input voltage and a reference voltage signal;
   an operational amplifier;
   a plurality of switches, configured to select to sample the input voltage and the reference voltage signal;
   an integrating capacitor, configured to perform integration superposition on the input voltage and the reference voltage signal sampled by the plurality of sampling capacitors; and
   a control assembly, configured to control operation of the plurality of switches, to select to sample the reference voltage signal or simultaneously sample the input voltage and the reference voltage signal within a cycle, and to perform clock control on the plurality of sampling capacitors that simultaneously sample the input voltage and the reference voltage signal within a next cycle,
   the method comprising following steps of:
   S1. operating the plurality of switches to simultaneously sample the input voltage and the reference voltage signal by the plurality of sampling capacitors;
   S2. performing integration superposition on the input voltage and the reference voltage signal by the integrating capacitor;
   S3. operating the plurality of switches to input the reference voltage signal by the plurality of sampling capacitors for sampling;
   S4. performing integration superposition on the reference voltage signal by the integrating capacitor; and
   S5. repeating said step S1 to said step S4.

8. The method for sampling by the delta-sigma modulator of claim 7, wherein at said step S1, the input voltage is sampled by a capacitor pair, and the reference voltage signal is collected by idle capacitors.

9. The method for sampling by the delta-sigma modulator of claim 8, wherein at said step S1, the control assembly controls any pair of switches of said plurality of switches in an input sampling circuit to be switched off to sample the input voltage; and controls any switch in a reference voltage signal sampling circuit to be switched off to sample the reference voltage signal.

10. The method for sampling by the delta-sigma modulator of claim 7, wherein at said step S3, any pair of switches of said plurality of switches for the reference voltage signal are switched off to sample the reference voltage signal by a corresponding sampling capacitor pair.

11. The method for sampling by the delta-sigma modulator of claim 9, wherein at said step S3, any pair of switches of said plurality of switches corresponding to the sampling of the reference voltage signal comprise or do not comprise any switch in the reference voltage signal sampling circuit at said step S.

12. The method for sampling by the delta-sigma modulator of claim 7, wherein the control assembly controls switching of the plurality of switches at said step S1 to said step S4 by using timing control to realize periodic sampling and integral coupling.

13. The method for sampling by the delta-sigma modulator of claim 12, wherein the control assembly controls the switching of the plurality of switches by controlling a pseudo-random number generation timing.

14. The method for sampling by the delta-sigma modulator of claim 7, wherein the control assembly controls a proportion of an operating cycle at said step S1 to said step S4.

* * * * *